(12) United States Patent
Bulovic et al.

(10) Patent No.: US 9,472,723 B2
(45) Date of Patent: Oct. 18, 2016

(54) DEPOSITION OF SEMICONDUCTOR NANOCRYSTALS FOR LIGHT EMITTING DEVICES

(71) Applicant: Massachusetts Institute of Technology, Cambridge, MA (US)

(72) Inventors: Vladimir Bulovic, Lexington, MA (US); Katherine Wei Song, Cambridge, MA (US); Ronny Costi, Ashdod, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 14/091,355

(22) Filed: Nov. 27, 2013

(65) Prior Publication Data

US 2014/0147951 A1 May 29, 2014

Related U.S. Application Data

(60) Provisional application No. 61/730,236, filed on Nov. 27, 2012.

(51) Int. Cl.
| | | |
|---|---|---|
| *H01L 33/36* | (2010.01) | |
| *H01L 21/02* | (2006.01) | |
| *H01L 51/50* | (2006.01) | |
| *H01L 27/28* | (2006.01) | |
| *H01L 33/00* | (2010.01) | |
| *H01L 33/06* | (2010.01) | |
| *H01L 51/42* | (2006.01) | |

(52) U.S. Cl.
CPC ......... *H01L 33/36* (2013.01); *H01L 21/02057* (2013.01); *H01L 27/286* (2013.01); *H01L 33/005* (2013.01); *H01L 33/06* (2013.01); *H01L 51/4233* (2013.01); *H01L 51/502* (2013.01); *H01L 33/0087* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2007/0089784 A1* | 4/2007 | Noh et al. ...................... | 136/263 |
| 2007/0103068 A1* | 5/2007 | Bawendi et al. ............. | 313/506 |
| 2009/0039764 A1* | 2/2009 | Cho et al. ...................... | 313/504 |
| 2010/0044636 A1* | 2/2010 | Ramprasad et al. ... | 252/301.6 S |
| 2011/0084326 A1* | 4/2011 | Dickerson et al. ........... | 257/296 |

OTHER PUBLICATIONS

Brown et al., Quantum Dot Solar Cells. Electrophoretic Deposition of CdSe—C60 Composite Films and Capture of Photogenerated Electrons with nC60 Cluster Shell, J. Am. Chem. Soc., 2008, 130 (28), pp. 8890-8891.*

\* cited by examiner

*Primary Examiner* — Andres Munoz
(74) *Attorney, Agent, or Firm* — Steptoe & Johnson LLP

(57) ABSTRACT

A method of depositing semiconductor nanocrystals on a surface can include applying a voltage to the nanocrystals.

15 Claims, 3 Drawing Sheets

DEPOSITION OF SEMICONDUCTOR NANOCRYSTALS FOR LIGHT EMITTING DEVICES

CLAIM OF PRIORITY

This application claims the benefit of prior U.S. Provisional Application No. 61/730,236 filed on Nov. 27, 2012, which is incorporated by reference in its entirety.

GOVERNMENT SPONSORSHIP

This invention was made with government support under Grant No. DE-SC0001088 awarded by the Department of Energy. The government has certain rights in the invention.

TECHNICAL FIELD

The invention features a method of depositing nanocrystals on a surface and the devices resulting therefrom.

BACKGROUND

Semiconductor nanocrystals can be used in a variety of biologic, chemical, electronic and optical applications.

SUMMARY

In one aspect, a method for depositing a film of semiconductor nanocrystals can include applying an voltage between two electrodes in a solution that includes a plurality of semiconductor nanocrystals, wherein the voltage creates an electric field that drives the plurality of semiconductor nanocrystals to be deposited onto a surface of the electrodes to form a semiconductor nanocrystal film, and wherein the thickness of the semiconductor nanocrystal film is less than 100 nm.

In certain embodiments, the plurality of semiconductor nanocrystals can be colloidal semiconductor nanocrystals. The plurality of semiconductor nanocrystals can include a Group II-VI compound, a Group II-V compound, a Group III-VI compound, a Group III-V compound, a Group IV-VI compound, a Group I-III-VI compound, a Group II-IV-VI compound, or a Group II-IV-V compound. The plurality of semiconductor nanocrystals can include CdSe and ZnS. Quantum yield of the plurality of semiconductor nanocrystals can be at least 10%, at least 50%, or at least 80%.

In certain embodiments, the semiconductor nanocrystal film can include a monolayer of semiconductor nanocrystals. The thickness of the semiconductor nanocrystal film can be less than 50 nm. The thickness of the semiconductor nanocrystal film can be less than 10 nm.

In certain embodiments, the solution can include a compound capable of removing passivating ligands surrounding the plurality of the semiconductor nanocrystals. The compound can include acetonitrile. The method can include washing the surface of the electrodes with a solvent while applying a voltage bias.

In certain embodiments, the solvent can include chloroform. The electric field can be between 25 V cm$^{-1}$ and 50 V cm$^{-1}$. The semiconductor nanocrystal film can have a RMS roughness of less than 5 nm.

In another aspect, a method for fabricating a light emitting device can include depositing a first electrode on a substrate, depositing a layer of ITO onto the first electrode, depositing an electron transport layer, depositing a semiconductor nanocrystal layer by applying a voltage to create an electric field between two electrodes exposed to a solution containing a plurality of semiconductor nanocrystal, depositing a hole transporting layer, depositing a hole injection layer, and depositing a second electrode.

In certain embodiments, the semiconductor nanocrystal layer can be deposited on an anodic electrode. Turn-on voltage of the light emitting device corresponds to electron energies that can be lower than the semiconductor nanocrystal optical bandgap.

In another aspect, a device for preparing a semiconductor nanocrystal film can include a container configured to contain a solution that includes a plurality of semiconductor nanocrystals; a first electrode capable of being suspended in the container; and a second electrode capable of being suspended in the container, wherein the application of a voltage to create an electric field between the first electrode and the second electrode exposed to the solution drives the plurality of semiconductor nanocrystal to be deposited onto a surface of the electrodes to form the semiconductor nanocrystal film.

In certain embodiments, the semiconductor nanocrystal film can be deposited on an anodic electrode.

Other aspects, embodiments, and features will be apparent from the following description, the drawings, and the claims.

DETAILED DESCRIPTION

Figure 1A:
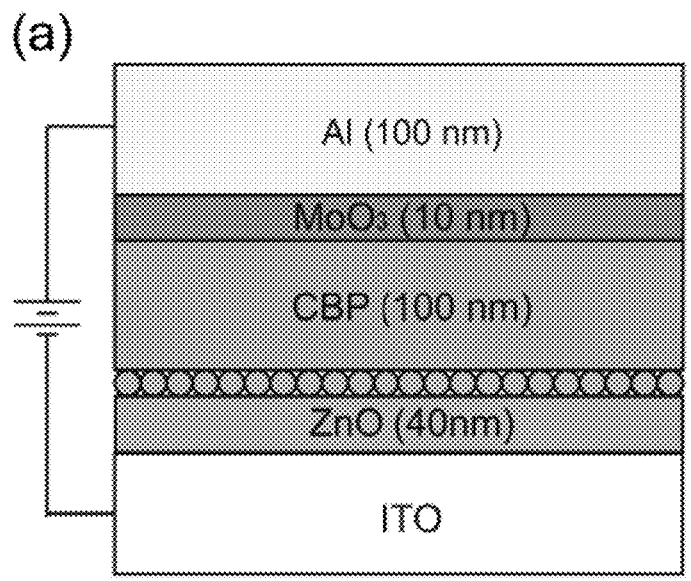
FIG. 1(a) shows a cross section schematic of a NC-LED showing the device layers and FIG. 1(b) shows a flat band energy diagram of a NC-LED showing the device layers. The indicated band energies are in units of eV and are all referenced to the vacuum level.

The electrophoretic deposition (EPD) of thin films of colloidal semiconductor nanocrystals can be an alternative to spin-casting and printing for the large-area, high throughput processing of semiconductor nanocrystal optoelectronics. Semiconductor nanocrystal light emitting diodes (NC- LEDs) can be prepared with electrophoretically deposited films of semiconductor nanocrystals. The devices with peak emission energy of 2.0 eV can exhibit sub-bandgap turn-on voltages of 1.8 V and external quantum efficiencies (EQE) as high as 1.5%, a value comparable to that of NC-LEDs fabricated using the spin-casting method for semiconductor nanocrystal films under similar conditions. A method for depositing a film of semiconductor nanocrystals can include applying an electric field between two electrodes in a solution that includes a plurality of semiconductor nanocrystals, wherein the electric field drives the plurality of semiconductor nanocrystals to be deposited onto a surface of the electrodes to form a semiconductor nanocrystal film, and wherein the thickness of the semiconductor nanocrystal film is less than 100 nm.

NC-LEDs can form the foundation of the next generation of lighting and display technologies, due to the unique optical properties of colloidally-synthesized semiconductor nanocrystals (NCs). See, for example, C. B. Murray, D. J. Norris, M. G. Bawendi, *J. Am. Chem. Soc.* 1993, 115(19), 8706-8715; B. O. Dabbousi, J. Rodriguez Viejo, F. V. Mikulec, J. R. Heine, H. Mattoussi, R. Ober, K. F. Jensen, M. G. Bawendi, *J. Phys. Chem. B* 1997, 101(46), 9463-9475; P. O. Anikeeva, J. E. Halpert, M. G. Bawendi, V. Bulović, *Nano Lett.* 2007, 7(8), 2196-2200; S. Coe-Sullivan, W. Woo, M. G. Bawendi, V. Bulović, *Nature* 2002, 420, 800-803, each of which is incorporated by reference in its entirety. Semiconductor nanocrystals can also be referred to as semiconductor nanocrystals. Thin NC films have been shown to exhibit high brightness, a broad excitation spectrum, and a narrow emission bandwidth that is tunable over the entire visible spectrum; under electrical excitation, they have been shown to yield NC-LEDs of highly saturated color. See, for example, P. O. Anikeeva, J. E. Halpert, M. G. Bawendi, V. Bulović, *Nano Lett.* 2009, 9, 2532-2536, which is incorporated by reference in its entirety. The most efficient NC-LEDs demonstrated to-date are fabricated by spin-casting colloidal semiconductor nanocrystal solutions into semiconductor nanocrystal films of controllable and uniform thickness, yielding NC-LEDs with external quantum efficiencies (EQE) above 18%. See, for example, S. A. Coe-Sullivan, Z. Zhou, Y. Niu, J. Perkins, M. Stevenson, C. Breen, P. T. Kazlas, J. S. Steckel, *SID Symp. Dig. Tech. Pap.* 2011, 42, 135-138; S. Coe-Sullivan, presented at SID Display Week 2012 (Seminar M-5), Boston, Mass., Jun. 4, 2012, each of which is incorporated by reference in its entirety. Contact printing of semiconductor nanocrystal films has also been used to fabricate patterned NC-LEDs with features on the scale of 25 µm, as would be needed for high-resolution pixelated multi-color light emitters. See, for example, L. Kim, P. O. Anikeeva, S. A. Coe-Sullivan, J. S. Steckel, M. G. Bawendi, V. Bulović, *Nano Lett.* 2008, 8(12), 4513-4517, each of which is incorporated by reference in its entirety. More simply, colloidal solutions of semiconductor nanocrystals can be ink-jet printed to generate patterned luminescent films, with the benefit of high utilization of the starting material but with the tradeoff of lower resolution of the resulting features and less thickness uniformity. See, for example, V. Wood, M. J. Panzer, J. Chen, M. S. Bradley, J. E. Halpert, M. G. Bawendi, V. Bulović, *Adv. Mater.* 2009, 21, 2151-2155; M. J. Panzer, V. Wood, S. M. Geyer, M. G. Bawendi, V. Bulović, *IEEE J. Disp. Tech.* 2010, 6, 90-93, each of which is incorporated by reference in its entirety. An alternative method can be investigated for the large-area deposition of luminescent semiconductor nanocrystal films by demonstrating electrophoretic deposition (EPD) of semiconductor nanocrystal thin films from electrostatically-assembled colloidal semiconductor nanocrystal solutions. See, for example, O. O. Van der Biest, L. J. Vandeperre, *Annu. Rev. Mater. Sci.* 1999, 29, 327-352; M. A. Islam, I. P. Herman, *Appl. Phys. Lett.* 2002, 80(20), 3823-3825; M. A. Islam, Y. Q. Xia, D. A. Telesca, M. L. Steigerwald, I. P. Herman, *Chem. Mater.* 2004, 16(1), 49-54; P. Brown, P. V. Kamat, *J. Am. Chem. Soc.* 2008, 130(28), 8890-8891, each of which is incorporated by reference in its entirety.

The nanocrystal (NC), or the semiconductor nanocrystal, can be a member of a population of nanocrystals having a narrow size distribution. The nanocrystal can be a sphere, rod, disk, or other shape. The nanocrystal can include a first semiconductor material, a ceramic material, a magnetic material, or a metallic material, for example, gold, iron oxide, titanium dioxide, cerium oxide or other metal chalcogenide or pnictide. The nanocrystal can include a first semiconductor material having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. The first semiconductor material can include a Group II-VI compound, a Group II-V compound, a Group III-VI compound, a Group III-V compound, a Group IV-VI compound, a Group I-III-VI compound, a Group II-IV-VI compound, a Group II-IV-V compound, or mixtures thereof. For example, the first semiconductor material can include for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

In some embodiments, the nanocrystal includes a first semiconductor material including a Group I-III-VI compound. For example, the first semiconductor material can include for example, a copper indium diselenide such as a doped copper indium diselenide or other copper indium diselenide, or alloyed copper indium diselenide, such as, for example, copper indium zinc diselenide, or copper indium gallium diselenide. The first semiconductor material can include a copper indium disulfide such as a doped copper indium disulfide or other copper indium disulfide, or alloyed copper indium disulfide. Other elements alloyed with copper indium diselenide and/or copper indium disulfide can include sulfur, aluminum, or silver; for example, $CuInS_2$, $CuIn(S, Se)_2$, $Cu(In,Al)Se_2$, $Cu(In,Ag)Se_2$, or others.

The nanocrystal can include a second semiconductor material. The second semiconductor material can include a composition different from the composition of the first semiconductor material. The first and second semiconductor materials can be selected to provide a desired band structure, such as a type I or a type II heterostructure. The second semiconductor material can be adjacent to the first semiconductor material, such that a junction is formed. The junction can be abrupt or graded. In a graded junction, the first material blends with the second material in the junction, providing a graded change in material. In contrast, in an abrupt junction there is little or substantially no blending of the materials.

The second semiconductor material of the nanocrystal can include a Group II-VI compound, a Group II-V compound, a Group III-VI compound, a Group III-V compound, a Group IV-VI compound, a Group I-III-VI compound, a Group II-IV-VI compound, a Group II-IV-V compound, or mixtures thereof. For example, the second semiconductor material can include ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals.

An alloy can have the formula $M^1_iM^2_jM^3_kE^1_xE^2_yE^3_z$. $M^1$, $M^2$ and $M^3$ can each independently be a group I, group II, group III, or group IV element. $E^1$, $E^2$ and $E^3$ each independently can be a group IV, group V, or group VI element. For example, $M^1$, $M^2$ and $M^3$ can each independently be magnesium, zinc, copper, cadmium, mercury, aluminum, gallium, indium, thallium, silicon, germanium, tin, or lead; and $E^1$, $E^2$ and $E^3$ each independently can be silicon, germanium, tin, lead, nitrogen, phosphorus, arsenic, antimony, oxygen, sulfur, selenium, or tellurium.

The values of i, j, k, x, y, and z are positive or zero. In some instances, the value of i, j, k, x, y, or z can be an integer. For example, an alloy can have the formula $M^1E^1_xE^2_y$. In this formula, the value of i is 1 and the values of j and k are zero (alternatively, $M^1$, $M^2$ and $M^3$ are identical), and the value of z is zero (alternatively, $E^2$ and $E^3$ are identical). The sum of i, j and k can be an integer, and the sum of x, y and z can be an integer. For example, if the sum of x and y is 1, the preceding formula can be expressed as $M^1E^1_xE^2_{1-x}$. In another example, an alloy can have the formula $M^1_iM^2_{1-i}E^1$. An alloy can have the formula $M^1_iM^2_jM^3_kE^1_x$ or $M^1_iM^2_jM^3_kE^1_xE^2_y$.

A nanocrystal having a central region and a distal region (or regions) can be described by a radius ratio. The radius ratio can be defined as the ratio of the radius of the distal region to the radius of the central region. The central region can have a radius in the range of 1 nm to 7 nm (such as between 1.5 nm and 5 nm), and the distal regions can have a radius in the range of 1 nm to 10 nm (such as between 1.5 nm and 5 nm). Accordingly, a barbell-shaped nanocrystal can have a radius ratio in the range of 0.1 to 10 (such as between 0.3 and 3.5). In some embodiments the radius ratio can be about 1. In other embodiments it can be substantially different than about 1, such as, for example, between 0.1 and 0.95 or between 1.05 and 10.

The junction between two semiconductor materials can have different configurations depending on the shape of the nanocrystal. For example, a spherical nanocrystal can have a spherical core of a first semiconductor material coated with a shell of a second semiconductor material. A rod shaped nanocrystal can have a rod of a first semiconductor material and a second semiconductor material. The second semiconductor material can coat the length and ends of the rods substantially evenly. Alternatively, the length and ends of the rod can be coated to different degrees. In particular, the ends of the rod can coated to a greater degree than the length of the rod. The ends of the rod each can be coated by an approximately spherical region of a second semiconductor material. In this case, the nanocrystal can have a barbell shape.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region.

The population of nanocrystals can have a narrow size distribution. The population can be monodisperse and can exhibit less than a 15% rms deviation in size of the nanocrystals, preferably less than 10%, more preferably less than 5%. Spectral emissions in a narrow range of between 10 and 150 nm full width at half max (FWHM) can be observed (in other words, FWHM of less than 0.05 eV, or of less than 0.03 eV). Semiconductor nanocrystalscan have emission quantum efficiencies of greater than 2%, 5%, 10%, 20%, 40%, 60%, 70%, or 80%.

The method of manufacturing a nanocrystal can be a colloidal growth process and can produce a monodisperse particle population. Colloidal growth occurs by rapidly injecting an M donor(s) and an E donor(s) into a hot coordinating agent. In another variation, the M donor or M donors are dissolved in a hot coordinating agent, and an E donor or E donors are rapidly injected. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. Preparation and manipulation of nanocrystals are described, for example, in U.S. Pat. No. 6,322,901, which is incorporated by reference in its entirety.

The nanocrystal is a member of a population of nanocrystals. As a result of the discrete nucleation and controlled growth, the population of nanocrystals obtained can have a narrow, monodisperse distribution of sizes. The process of controlled growth and annealing of the nanocrystals in the coordinating agent that follows nucleation can also result in uniform surface derivatization and regular core structures. As the size distribution sharpens, the temperature can be raised to maintain steady growth. By adding more M donor or E donor, the growth period can be shortened.

The M donor(s) can be an inorganic compound, an organometallic compound (e.g., an alkyl metal compound such as triethyl gallium or trimethyl indium), or elemental metal. The inorganic compound can be a salt (e.g., a carboxylate salt, an acetylacetonate salt, a metal halide, a metal oxide, a metal alkoxide, and the like). The salt can be combined with a coordinating agent, such as an amine. See, for example, U.S. Pat. No. 6,576,291, which is incorporated by reference in its entirety. M can be cadmium, zinc, copper, magnesium, mercury, aluminum, gallium, indium or thallium. The E donor(s) can be a compound capable of reacting with the M donor to form a material with the general formula $M^1_iM^2_jM^3_kE^1_xE^2_yE^3_z$. Typically, the E donor is a chalcogenide donor or a pnictide donor, such as a phosphine chalcogenide, a bis(silyl) chalcogenide, dioxygen, an ammonium salt, or a tris(silyl) pnictide. Suitable E donors include dioxygen, bis(trimethylsilyl) selenide ($(TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ($(TMS)_2Te$), bis(trimethylsilyl)sulfide ($(TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide ($(TMS)_3P$), tris(trimethylsilyl) arsenide ($(TMS)_3As$), or tris(trimethylsilyl) antimonide ($(TMS)_3Sb$). In certain embodiments, the M donor and the E donor can be moieties within the same molecule.

A coordinating agent can help control the growth of the nanocrystal. The coordinating agent is a compound having a donor lone pair that, for example, has a lone electron pair available to coordinate to a surface of the growing nanocrystal. The coordinating agent can be a solvent. Solvent coordination can stabilize the growing nanocrystal. Typical coordinating agents include alkyl phosphines, alkyl phosphine oxides, alkyl phosphonic acids, or alkyl phosphinic acids, however, other coordinating agents, such as pyridines, furans, and amines may also be suitable for the nanocrystal production. Examples of suitable coordinating agents include pyridine, tri-n-octyl phosphine (TOP) and tri-n-octyl phosphine oxide (TOPO). Technical grade TOPO can be used.

Nanocrystal shape can be determined by synthesis conditions, notably by the coordinating solvent(s) present during nanocrystal synthesis. The nanocrystal can be a sphere, rod, disk, or other shape. See, e.g., U.S. Pat. Nos. 6,225,198; 6,306,736; and 6,855,202, each of which is incorporated by reference in its entirety. Nanocrystal shape can be further controlled by the conditions under which a second semiconductor material is added to the nanocrystal.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average size, a population having a desired average nanocrystal size can be obtained.

The particle size distribution can be further refined by size selective precipitation with a poor solvent for the nanocrystals, such as methanol/butanol as described in U.S. Pat. No. 6,322,901, incorporated herein by reference in its entirety. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean size, preferably 10% rms deviation or less, and more preferably 5% rms deviation or less.

A cap including a second semiconductor material can be added to the nanocrystal. A capping process is described, for example, in U.S. Pat. No. 6,322,901, which is incorporated by reference in its entirety. By adjusting the temperature of the reaction mixture during capping and monitoring the absorption spectrum of the core, capped materials having high emission quantum efficiencies and narrow size distributions can be obtained. The shape of the cap can depend on the shape of the initial nanocrystal and the capping conditions used. For example, a cap grown on an approximately spherical nanocrystal can also be approximately spherical. In this case, the cap can substantially coat the spherical nanocrystal. If the initial nanocrystal is rod-shaped, the cap can be grown primarily on the ends of the rod and very little of the second semiconductor material added along the axis of the rod. A rod-shaped nanocrystal can be capped with a rod-shaped cap, or with an approximately spherical cap. Capping conditions, such as solvent composition and temperature, can determine the shape of the cap. For example, when caps are added under conditions that favor rod-shaped growth, rod-shaped caps can be formed; in contrast, approximately spherical caps are formed when the capping conditions favor approximately spherical growth.

It can be advantageous to purify nanocrystals before a second material is added to the nanocrystal. As discussed above, the nanocrystals can be purified by size-selective precipitation. After purification the nanocrystals can be treated with an etching agent. The etching agent can reduce the number of defect sites on the nanocrystals. Defect sites can act as undesired nucleation sites during addition of a second material. In making barbell-shaped nanocrystals, nucleation is desired at the ends of rods, but defect sites can cause nucleation along the length of a rod. Because the etching agent reduces the number of defect sites, the resulting barbells will have fewer warts along the length of the rods than barbells prepared without a prior etching treatment. The etching agent can be an amine, such as a primary amine, e.g., octylamine. An etching agent can be included during addition of a second semiconductor material to a nanocrystal.

Two-pot synthesis of nanocrystals can improve (compared to one-pot synthesis) the quality of the heterojunction by minimizing contamination of the one material with the other material. Adding the nanocrystals at temperatures normally used for core growth (rather than nucleation) can reduce overcoating of a rod (e.g., along the length of the rod) by the second semiconductor material.

The outer surface of the nanocrystal can include a layer of compounds derived from the coordinating agent used during the growth process. The surface can be modified by repeated exposure to an excess of a competing coordinating group to form an overlayer. For example, a dispersion of the nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

Under EPD process, colloidal particles suspended in a liquid medium can migrate under the influence of an electric field and are deposited onto an electrode. The electric field enables the consolidation of particles into files, cast onto any shaped substrate. Colloidal particles that can carry a charge can be used in electrophoretic deposition. This includes materials such as semiconductors, polymers, ceramics and metals.

Voltages of 5-400 volts can be used in EPD process, for example, between 8 V and 300 V or 10 V and 250 V. Electric field strength for electrophoretic deposition can be between 3 V cm$^{-1}$ and 100 V cm$^{-1}$, for example, between 5 V cm$^{-1}$ and 90 V cm$^{-1}$ or 8 V cm$^{-1}$ and 80 V cm$^{-1}$. The material of an electrode can include indium, indium tin oxide, tin oxide, doped tin oxide, zinc oxide, doped zinc oxide, graphene, doped graphene, polymer, carbon nanotube, ceramic oxide, silver, gold, platinum, palladium, molybdenum oxide, lithium fluoride, cesium carbonate, calcium, aluminum, or a mixture thereof. Concentrations of semiconductor nanocrystals can be between selected to optimize the growth rate of the film.

The EPD of semiconductor nanocrystal thin films can be accomplished by applying a voltage between two conductive electrodes that are suspended in a colloidal semiconductor nanocrystal solution. The electric field established between the electrodes drives the semiconductor nanocrystal deposition onto the electrodes. The benefit of EPD as a manufacturing process is the efficient use of the starting colloidal semiconductor nanocrystal solutions (in contrast to spin-casting, in which the majority of the used semiconductor nanocrystal solution is spun off the substrate and is unrecoverable). EPD also allows parallel processing (multiple devices may be fabricated simultaneously in the same EPD bath), and it enables deposition of films onto electrodes of arbitrary size, shape, and texture, conforming the deposited film to the electrode geometry. In addition, while spin-casting semiconductor nanocrystals is a rapid film-forming process that can lead to disordered films containing semiconductor nanocrystals that are not in a mechanical equilibrium, EPD is a slower deposition process that can allow semiconductor nanocrystals to assemble and pack in a more energetically favorable structure on the surface of the substrate. Such EPD-assembled films can in turn improve LED performance and/or operating lifetime. Thick (>100 nm) films that can be unsuitable for NC-LEDs, where a semiconductor nanocrystal layer of a few monolayers in thickness is required for efficient electroluminescence. See, for example, N. J. Smith, K. J. Emmett, S. J. Rosenthal, *Appl. Phys. Lett.* 2008, 93, 043504; S. Ameen, M. S. Akhtar, S. G. Ansari, O.-B. Yang, H.-S. Shin, *Superlattices Microstruct.* 2009, 46(6), 872-880; A. Salant, M. Shalom, I. Hod, A. Faust, A. Zaban, U. Banin, *ACS Nano* 2010, 4(10), 5962-5968, each of which is incorporated by reference in its entirety. NC-LEDs can be fabricated with a thin, electrophoretically deposited semiconductor nanocrystal layer in place of a spun-cast semiconductor nanocrystal film.

EPD can be used to deposit thin, uniform CdSe/ZnS colloidal semiconductor nanocrystal films a few monolayers in thickness. The films formed by EPD technique can be of high optical quality, as they enable the fabrication of bright and efficient NC-LEDs. The EQEs of EPD-fabricated NC-LEDs can be comparable to those of conventional NC-LEDs containing spun-on NC films. The turn-on voltage of the EPD-fabricated NC-LEDs corresponds to electron energies that are, surprisingly, lower than the semiconductor nanocrystal optical bandgap. The results of this study on EPD NC-LEDs indicate that EPD can be a viable alternative to spin-casting in the fabrication of semiconductor nanocrystal optoelectronic structures.

EXAMPLE

Figure 1B:
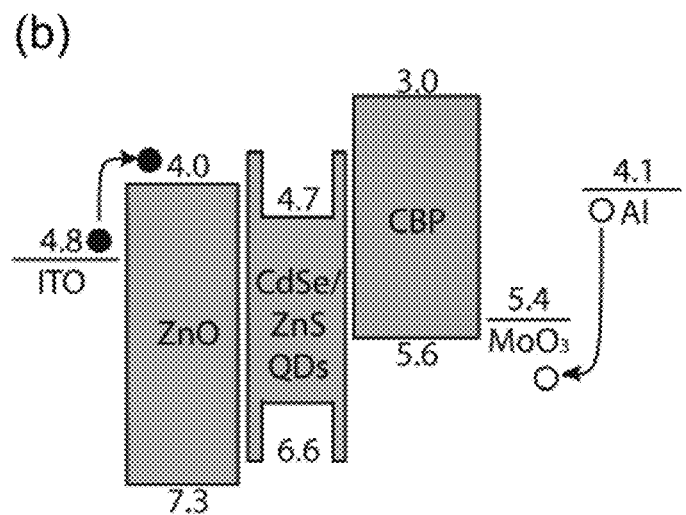

FIG. 1 portrays a layered NC-LED device cross section (FIG. 1a) and a proposed flat-band energy diagram (FIG. 1b), with energy levels taken from literature. See, for example, S. Tokito, K. Noda, Y. Taga, J. Phys. D: *Appl. Phys.* 1996, 29(11), 2750-2753; G. E. Jabbour, Y. Kawabe, S. E. Shaheen, J. F. Wang, M. M. Morrell, B. Kippelen, N. Peyghambarian, *Appl. Phys. Lett.* 1997, 71(13), 1762-1764; I. G. Hill, A. Kahn, *J. Appl. Phys.* 1999, 86(8), 4515-4519; V. Wood, M. J. Panzer, J. E. Halpert, J. M. Caruge, M. G. Bawendi, V. Bulović, *ACS Nano* 2009, 3(11), 3581-3586, each of which is incorporated by reference in its entirety. The NCs used are colloidal CdSe/ZnS core/shell semiconductor nanocrystals capped with carboxylic acid ligands, which allow the semiconductor nanocrystals to be solution processable and improve the photoluminescence (PL) quantum yield (QY) of the semiconductor nanocrystals by reducing surface trap states and the spatial overlap in the wavefunctions of charge carriers residing on the semiconductor nanocrystals. The PL peak of the semiconductor nanocrystal solutions used in this study appears at a wavelength of $\lambda$=610 nm, and each semiconductor nanocrystal-ligand complex is between 8 nm and 10 nm in diameter.

Fabrication of the NC-LEDs starts with a commercially purchased, pre-patterned indium tin oxide (ITO) electrode on a glass substrate. After the substrate is washed with solvents and cleaned with oxygen plasma exposure, a 40 nm thick zinc oxide (ZnO) electron transport layer is formed by spin-casting zinc acetate solution onto the substrate and annealing it at 300° C. for 5 minutes in air. Then, a 10 nm thick semiconductor nanocrystal film is electrophoretically deposited in an EPD process, described below in detail. The samples are then transferred into a vacuum chamber (with a base pressure of $10^{-6}$ Torr), where a 100 nm thick 4,4'-N, N'-dicarbazolebiphenyl (CBP) hole transporting layer, a 10 nm thick molybdenum oxide ($MoO_3$) hole injection layer, and a 100 nm thick aluminum (Al) anode are deposited by sequential thermal evaporation.

For control devices, a semiconductor nanocrystal solution calibrated for a known end thickness is spun onto the ZnO-on-ITO/glass stack in a nitrogen ambient glovebox. For devices with an EPD semiconductor nanocrystal layer, the following procedure is used: An amber glass vial, containing a 0.1 mg mL$^{-1}$ semiconductor nanocrystal solution in a 10:1 ratio chloroform:acetonitrile solution, is placed into a sonication bath. The addition of acetonitrile partially removes passivating ligands surrounding the semiconductor nanocrystals, thus allowing surface traps on the semiconductor nanocrystal to be affected by the electric field. Without the addition of acetonitrile, the EPD rate of semiconductor nanocrystals on the electrodes is greatly diminished. This observation is consistent with the measurement of electrical current through the EPD setup: the current with semiconductor nanocrystals and no acetonitrile is comparable to the current observed when only chloroform (without semiconductor nanocrystals) is present; the current in the presence of acetonitrile, on the other hand, is approximately one order of magnitude higher. An excess of acetonitrile (and/or other solvents, such as acetone) causes semiconductor nanocrystals to aggregate and crash out of solution, leading to thick films composed of large semiconductor nanocrystal agglomerates.

Figure 2A:
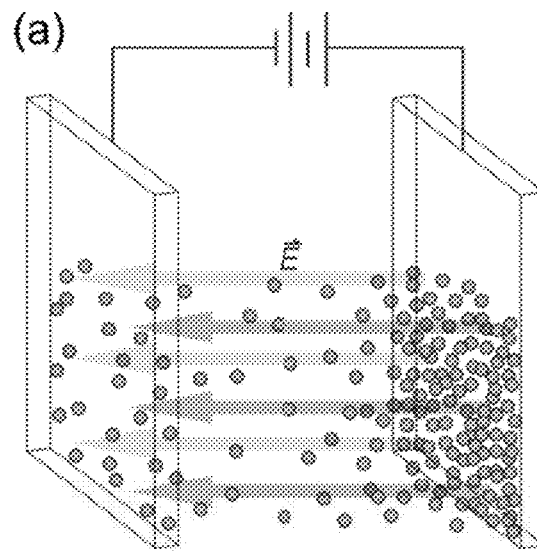
FIG. 2(a) shows a schematic depiction of the electrophoretic deposition process. A voltage applied between two parallel, conducting electrodes spaced 0.4 cm apart drives the deposition of the particles (NCs).

To start the EPD process, two ZnO-on-ITO/glass substrates are secured 0.4 cm apart with their conductive sides parallel and facing toward one another, as illustrated in FIG. 2a. An electric field in the range of 25-50 V cm$^{-1}$ is then applied, and the electrodes are placed into the semiconductor nanocrystal solution. After a fixed time (a few minutes in duration), the electrodes are lifted out of the semiconductor nanocrystal solution and, with the voltage bias remaining on, washed by dipping into a vial filled with neat chloroform for 15 seconds. This washing step removes aggregates and semiconductor nanocrystals that are not well bound to the surface, as well as NC rich chloroform droplets that would leave uneven semiconductor nanocrystal deposits behind upon drying. The EPD procedure is performed in air. After the EPD of the semiconductor nanocrystal film is complete, the samples are transferred to a nitrogen ambient glovebox and remain in an oxygen-free environment for the remainder of the fabrication process.

Figure 2B:
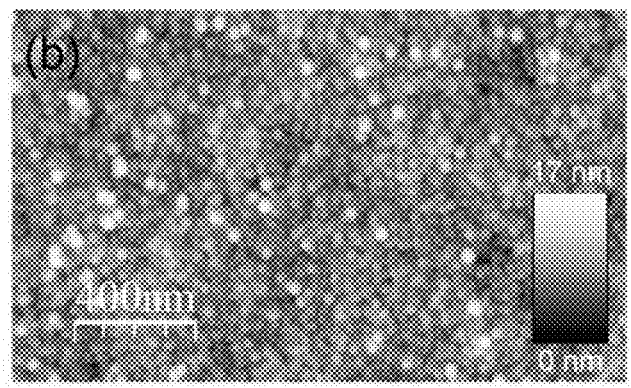
FIG. 2(b) shows an AFM topography image of the surface of an electrophoretically deposited NC film with RMS roughness of 2.3 nm. This film is formed during a 5 minute, 50 V cm$^{-1}$ anodic deposition from a 0.1 mg mL$^{-1}$ NC solution and is followed by a chloroform rinse.
Figure 2C:
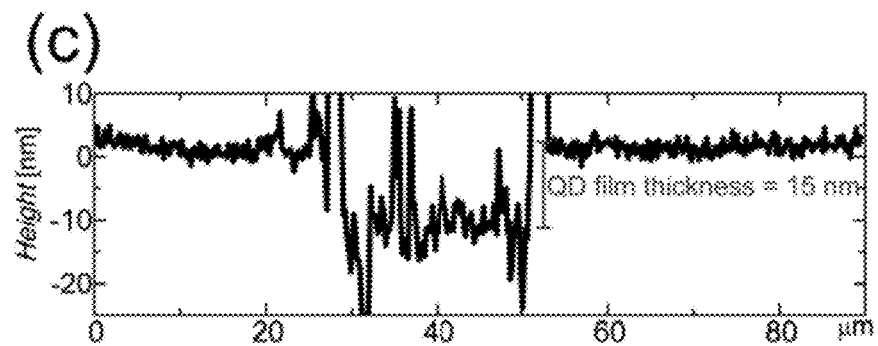
FIG. 2(c) shows an AFM cross sectional profile over a scratch in the NC film, showing a film thickness of 15 nm.

An atomic force microscopy (AFM) topography image of an EPD semiconductor nanocrystal film on a ZnO-on-ITO anode is shown in FIG. 2b. WSxM software was used. See, for example, I. Horcas, R. Fernandez, J. M. Gomez-Rodriguez, J. Colchero, J. Gomez-Herrero, A. M. Baro, *Rev. Sci. Instrum.* 2007, 78(1), which is incorporated by reference in its entirety. The EPD process lasted 5 minutes in a semiconductor nanocrystal solution, with a 15 second rinse in chloroform, all under a 20 V applied bias (corresponding to an electric field of 50 V cm$^{-1}$). The resulting semiconductor nanocrystal film roughness is 2.3 nm, which is slightly greater than the 1.5 nm roughness of the underlying ZnO-on-ITO substrate. The thickness of the semiconductor nanocrystal film is measured by taking an AFM cross section of a step scratched into the semiconductor nanocrystal film and is found to be 15 nm, or between 1 and 2 monolayers (FIG. 2c). Under ultraviolet light, fluorescence of the semiconductor nanocrystal films can be observed by eye on both the positive and negative electrodes. However, the film on the positive electrode appears brighter, suggesting that more luminescent dots are attracted to the positive electrode during deposition.

Figure 3A:
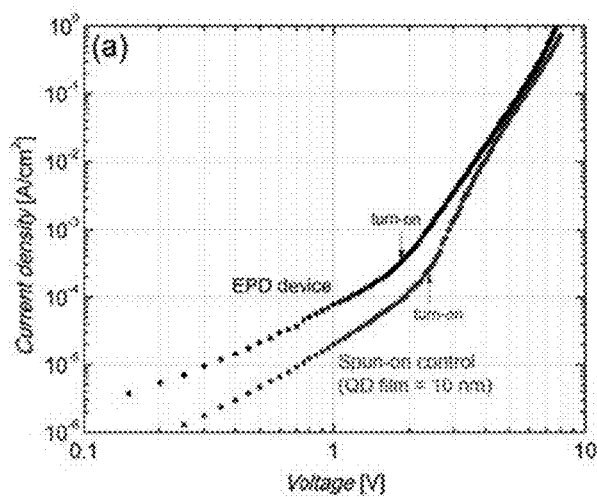
FIG. 3(a) shows current density vs. applied voltage characteristics and 3(b) shows external quantum efficiency (EQE) vs. current density of a NC-LED containing an electrophoretically deposited NC film (black) and a NC-LED with a 10 nm spun-on NC film (red) showing an early turn-on voltage of 1.8 V and a 1.5% EQE for the EPD device. Inset: 10 EPD NC-LEDs (each 1.7 mm×0.7 mm in size) operating simultaneously in the dark at ~100 cd m$^{-2}$. The EPD film was formed by a 5 minute, 25 V cm$^{-1}$ anodic deposition.
Figure 3B:
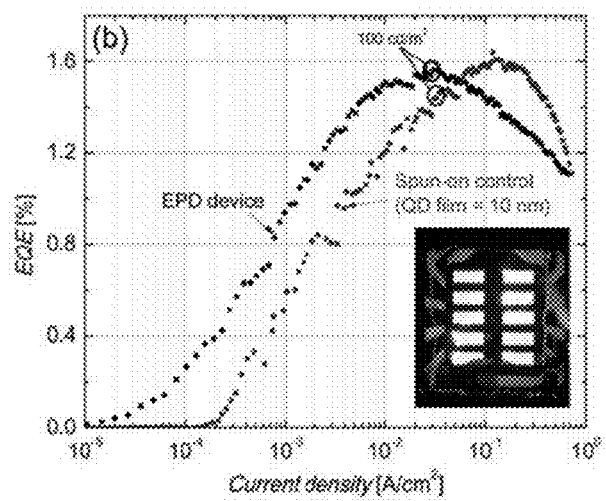
FIG. 3(c) shows electroluminescence (EL) spectra for EPD and spun-on NC-LEDs, where the EPD devices display red shifts in comparison to the spun-on sample. The FWHM of the anodic EPD NC-LED is 16% wider than the cathodic EPD and the spun-on devices. The solution photoluminescence (PL) spectrum is also shown for reference.

Current-voltage and external quantum efficiency (EQE) characteristics for a completed EPD NC-LED, along with those of a control spun-cast NC-LED device, are shown in FIG. 3. A 10 nm semiconductor nanocrystal film is spun on for the control device to closely match the thickness of the electrophoretically deposited films and thus provide the most relevant reference for comparison. The EPD device shown uses an anodic electrophoretically deposited semiconductor nanocrystal film, and the deposition is carried out for 5 minutes under an applied potential of 10 V (25 V cm$^{-1}$ electric field). The EPD NC-LED exhibits a turn-on voltage of 1.8 V, a value that is lower than the 2 V expected, given the 2.0 eV optical bandgap of the dots, and the control device has a turn-on voltage of 2.1 V. The peak EQE of the EPD NC-LED and the control device is 1.5% and 1.6%, respectively. The peak power efficiencies are 1.79 lm/W for the EPD NC-LED and 1.80 lm/W for the control NC-LED. The EPD and control devices reach 100 cd m$^{-2}$, the luminance value often taken as "video brightness" in literature, under applied voltages of 4.7 V and 4.9 V, respectively, when their EQEs are 1.54% and 1.44%, respectively. See, for example, H. Sirringhaus, N. Tessler, R. H. Friend, *Science* 1998, 280(5370), 1741-1744, which is incorporated by reference in its entirety. Inset in FIG. 3b is a photograph of 10 EPD NC-LEDs (dimensions: 1.7 mm×0.7 mm) operating simultaneously at video brightness in the dark.

The EPD NC-LEDs with the highest EQE in each fabrication batch are consistently ones of the anodic EPD electrodes. Devices of the cathodic EPD electrodes demonstrate EQEs on the order of 0.1%, and "dipped" devices, where no bias is applied while preforming the same EPD procedure, achieve EQEs no higher than 0.5%. We note that the optimal combination of Parameters—applied voltage and time of deposition—for which the highest device EQE is achieved varies between runs. This can be attributed to a high degree of sensitivity to factors that are not controlled in the experimental setup, such as temperature, humidity, and inadvertent impurities in the solutions used for the deposition processes. In a study by M. Islam et al., it was shown that the presence of impurities (including free ligands) in the solution of electrophoretically deposited 0.5 μm thick CdSe nanocrystal films greatly affects nanocrystal aggregation and adhesion to the electrode. This impurity-induced variation in film morphology is very likely present in the setup and would indeed, in turn, cause a variation in the NC-LED performance.

Figure 3C:
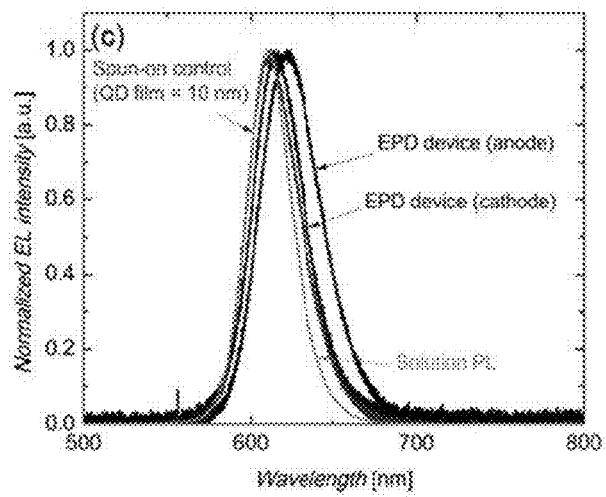

FIG. 3c shows electroluminescence (EL) spectra for EPD and spun-on devices measured at video brightness, as well as the photoluminescence (PL) spectrum for the semiconductor nanocrystals in solution for reference. The EL peak for the anodic EPD device with characteristics plotted in FIG. 3 appears at λ=623 nm, which is red shifted from the EL peak of the spun-on control device by 12 nm. The full width at half maximum of the EL peak of the anodic EPD device is 45 nm, which is 7 nm broader than that of the control. In contrast, the red shift seen in cathodic EPD devices, as well as "dipped" devices, is only 5 nm with no significant broadening. This red shift can be attributed to a denser semiconductor nanocrystal film which would exhibit a solvatochromic red shift. See, for example, C. A. Leatherdale, M. G. Bawendi, *Phys. Rev. B* 2001, 63(16), 165315, which is incorporated by reference in its entirety. Alternatively, the red-shifted emission might originate from semiconductor nanocrystal agglomerates that can form in the presence of acetonitrile even before their deposition onto the electrodes. See, for example, C. R. Kagan, C. B. Murray, M. Nirmal, M. G. Bawendi, *Phys. Rev. Lett.* 1996, 76(9), 1517-1520, which is incorporated by reference in its entirety. Finally, it is possible that the anodic EPD process forms a permanent electric dipole layer at the interface with the ZnO film, which would affect the semiconductor nanocrystals via the electric-field-induced Stark shift.

Although the present invention is described with several particular embodiments, various changes and modifications can be suggested by one skilled in the art. In particular, the present invention is described with reference to certain polymers and materials and methods of processing those materials, but can apply to other types of processing and materials with little alteration and similar results. Furthermore, the present invention contemplates several process steps that may be performed either in the sequence described or in an alternative sequence without departing from the scope and the spirit of the present invention. The present invention is intended to encompass such changes and modification as they fall within the scope and the spirit of the appended claims.

What is claimed is:

1. A method for depositing a film of semiconductor nanocrystals comprising:
   applying a voltage between two electrodes in a solution that includes a plurality of semiconductor nanocrystals, wherein the voltage creates an electric field that drives the plurality of semiconductor nanocrystals to be deposited onto a surface of the two electrodes to form a semiconductor nanocrystal film, and wherein a thickness of the semiconductor nanocrystal film is less than 100 nm,
   washing a surface of the two electrodes with a solvent while applying a voltage bias.

2. The method of claim 1, wherein the plurality of semiconductor nanocrystals are colloidal semiconductor nanocrystals.

3. The method of claim 1, wherein the plurality of semiconductor nanocrystals include a Group II-VI compound, a Group II-V compound, a Group III-VI compound, a Group III-V compound, a Group IV-VI compound, a Group I-III-VI compound, a Group II-IV-VI compound, or a Group II-IV-V compound.

4. The method of claim 1, wherein the plurality of semiconductor nanocrystals include CdSe and ZnS.

5. The method of claim 1, wherein a quantum yield of the plurality of semiconductor nanocrystals is at least 10%.

6. The method of claim 1, wherein a quantum yield of the plurality of semiconductor nanocrystals is at least 50%.

7. The method of claim 1, wherein a quantum yield of the plurality of semiconductor nanocrystals is at least 80%.

8. The method of claim 1, wherein the semiconductor nanocrystal film includes a monolayer formed from the plurality of semiconductor nanocrystals.

9. The method of claim 1, wherein the thickness of the semiconductor nanocrystal film is less than 50 nm.

10. The method of claim 1, wherein the thickness of the semiconductor nanocrystal film is less than 10 nm.

11. The method of claim 1, wherein the solution includes a compound capable of removing passivating ligands surrounding the plurality of the semiconductor nanocrystals.

12. The method of claim 11, wherein the compound includes acetonitrile.

13. The method of claim 1, wherein the solvent includes chloroform.

14. The method of claim 1, wherein the electric field is between 25 V cm$^{-1}$ and 50 V cm$^{-1}$.

15. The method of claim 1, wherein the semiconductor nanocrystal film has a root mean square roughness of less than 5 nm.

\* \* \* \* \*